US008577062B2

United States Patent
Goldstein et al.

(10) Patent No.: US 8,577,062 B2
(45) Date of Patent: Nov. 5, 2013

(54) DEVICE AND METHOD FOR CONTROLLING OPERATION OF AN EARPIECE BASED ON VOICE ACTIVITY IN THE PRESENCE OF AUDIO CONTENT

(75) Inventors: Steven Wayne Goldstein, Delray Beach, FL (US); John Usher, Montreal (CA); Marc Andre Boillot, Plantation, FL (US)

(73) Assignee: Personics Holdings Inc., Boca Raton, FL (US)

( * ) Notice: Subject to any disclaimer, the term of this patent is extended or adjusted under 35 U.S.C. 154(b) by 1063 days.

(21) Appl. No.: 12/110,773

(22) Filed: Apr. 28, 2008

(65) Prior Publication Data

US 2009/0010444 A1  Jan. 8, 2009

Related U.S. Application Data

(60) Provisional application No. 60/914,318, filed on Apr. 27, 2007.

(51) Int. Cl.
  *H04R 25/00* (2006.01)
  *A61F 11/06* (2006.01)
  *G10K 11/16* (2006.01)
  *H03B 29/00* (2006.01)
  *G10L 15/20* (2006.01)

(52) U.S. Cl.
  USPC .......... 381/151; 381/328; 381/380; 381/71.5; 704/233

(58) Field of Classification Search
  USPC .............. 381/66, 110, 119, 328, 56–57, 151, 381/380, FOR. 133, 71.1, 94.1; 704/233, 704/E21.002

See application file for complete search history.

(56) References Cited

U.S. PATENT DOCUMENTS

| | | | |
|---|---|---|---|
| 6,415,034 B1 * | 7/2002 | Hietanen | 381/71.6 |
| 6,618,073 B1 | 9/2003 | Lambert et al. | |
| 6,728,385 B2 | 4/2004 | Kvaloy | |
| 2003/0123674 A1 * | 7/2003 | Boland | 381/66 |
| 2004/0196991 A1 * | 10/2004 | Iida et al. | 381/309 |
| 2005/0058313 A1 * | 3/2005 | Victorian et al. | 381/315 |
| 2005/0069161 A1 * | 3/2005 | Kaltenbach et al. | 381/312 |
| 2006/0262935 A1 * | 11/2006 | Goose et al. | 381/17 |
| 2007/0033029 A1 | 2/2007 | Sakawaki | |
| 2007/0086600 A1 | 4/2007 | Boesen | |
| 2007/0237341 A1 | 10/2007 | Laroche | |

OTHER PUBLICATIONS

Office Action for U.S. Appl. No. 12/169,386, filed Jul. 8, 2008, dated Mar. 14, 2012.

(Continued)

*Primary Examiner* — Daniel Luke
*Assistant Examiner* — Khaja Ahmad
(74) *Attorney, Agent, or Firm* — RatnerPrestia

(57) ABSTRACT

An earpiece (100) and a method (300) personalized voice operable control can include capturing (302) an ambient sound from an Ambient Sound Microphone (111) to produce an electronic ambient signal (426), delivering (304) audio content (402) to an ear canal (131) by way of an Ear Canal Receiver (125) to produce an acoustic audio content (404) and capturing (306) in the ear canal an internal sound (402) from an Ear Canal Microphone (123) to produce an electronic internal signal (410). The electronic internal signal includes an echo of the acoustic audio content and a spoken voice generated by a wearer of the earpiece. The Method also includes detecting (312) the spoken voice in the electronic internal signal in the presence of the echo, and controlling (314) a voice operation of the earpiece when the spoken voice is detected.

23 Claims, 7 Drawing Sheets

(56) References Cited

OTHER PUBLICATIONS

Office Action for U.S. Appl. No. 12/169,386, filed Jul. 8, 2008, dated Sep. 27, 2011.
Office Action for U.S. Appl. No. 12/102,555, filed Apr. 14, 2008, dated Mar. 14, 2012.
Office Action for U.S. Appl. No. 12/102,555, filed Apr. 14, 2008, dated Sep. 27, 2011.
Office Action for U.S. Appl. No. 12/102,555, filed Apr. 14, 2008, mailed Dec. 5, 2012.
Office Action for U.S. Appl. No. 12/169,386, filed Jul. 8, 2008, mailed Dec. 5, 2012.

* cited by examiner

500

DEVICE AND METHOD FOR CONTROLLING OPERATION OF AN EARPIECE BASED ON VOICE ACTIVITY IN THE PRESENCE OF AUDIO CONTENT

CROSS REFERENCE TO RELATED APPLICATIONS

This Application is a Non-Provisional and claims the priority benefit of Provisional Application No. 60/914,318 filed on Apr. 27, 2007, the entire disclosure of which is incorporated herein by reference. The Application is also related to, and incorporates by reference, material from Non-Provisional application Ser. No. 12/102,555 filed on Apr. 14, 2008, entitled "Method and Device for Voice Operated Control," claiming priority benefit of Provisional Application No. 60/911,691 filed on Apr. 13, 2007.

FIELD

The present invention pertains to sound processing in earpieces, and more particularly, to a device and method for controlling operation of an earpiece based on voice activity in the presence of audio content.

BACKGROUND

People use portable communication devices primarily for voice communications and music listening enjoyment. Although the portable communication devices support multiple types of media experiences such as music listening and phone calls, they are not generally capable of handling a user's interactive experience. For instance, when listening to music, a user may simultaneously receive a phone call or attempt to leave a voice message. The portable communication device generally supports only one media function at a time, and thus attempts to gracefully close or pause one media experience before starting the next media experience.

When a user is wearing earphones or a headset, there are no general guidelines for the communication device to follow to determine which media experience receives primary attention. Further, the communication device may become confused when multiple media experiences are occurring simultaneously, for instance, when the communication device is attempting to process voice when a user is talking at the same time music is playing and background noise is prevailing in the environment. The microphone can pick up environmental sounds such as traffic, construction, and nearby conversations as well as the music and the user's voice. In such an arrangement, the communication device can experience difficulty in discriminating the user's voice from voices in the background and music in the foreground.

Although audio processing technologies can incorporate noise suppression, the communication device or headset is generally sound agnostic and cannot differentiate between sounds. A user desiring to speak into the earpiece may be competing with other people's voices in his or her proximity and also the music he or she is listening to.

A need therefore exists for a method and device of personalized voice operated control.

SUMMARY

Embodiments in accordance with the present invention provide a method and device for personalized voice operated control.

In a first embodiment, a method for personalized voice operable control can include the steps of capturing an ambient sound from at least one Ambient Sound Microphone (ASM) to produce an electronic ambient signal, delivering audio content to an ear canal by way of an Ear Canal Receiver (ECR) to produce an acoustic audio content, and capturing in the ear canal an internal sound from at least one Ear Canal Microphone (ECM) to produce an electronic internal signal. The electronic internal signal includes an echo of the acoustic audio content and a spoken voice generated by a wearer of the earpiece. The method can include detecting a spoken voice signal in the electronic internal signal based on an analysis of the electronic ambient sound signal and the electronic internal signal in the presence of the echo, and controlling at least one voice operation of the earpiece if the spoken voice is detected.

The method can include suppressing the echo of the audio content in the electronic internal signal to produce a modified electronic internal signal containing the spoken voice. In one arrangement, the suppressing can be performed by way of a normalized least mean squares algorithm. During the step of suppressing, an ear canal transfer function for a bone conduction signal can be measured. A voice activity level of the spoken voice can also be determined during the suppressing based on the electronic ambient signal and the modified electronic internal signal. The method can use the voice activity level to control a mixing of the electronic ambient signal and the modified electronic internal signal for producing a mixed signal. The mixed signal can be transmitted to a cell phone, a media player, a portable computing device, or a personal digital assistant. The mixed signal can also be combined with the audio content and delivered to the ear canal in a second mixing step.

In a second embodiment, a method for personalized voice operable control can include capturing an ambient sound from at least one Ambient Sound Microphone (ASM) to produce an electronic ambient signal, and capturing in an ear canal an internal sound from at least one Ear Canal Microphone (ECM) to produce an electronic internal signal. The electronic internal signal can include an echo of an acoustic audio content and a spoken voice generated by a wearer of the earpiece. The audio content can include music, voice mail, real-time phone communications, and/or the wearer's spoken voiced passed in the ear canal from the external ASM. The method can include generating a voice activity level for the spoken voice in the presence of the echo.

The method can include suppressing the echo in the electronic internal signal by way of a least mean squares algorithm to produce a modified electronic internal signal containing primarily the spoken voice. A mixing of the electronic ambient signal and the modified electronic internal signal can be controlled based on the voice activity level for producing a mixed signal. Further, a volume level of an audio content producing the echo that is delivered to the ear canal can also be adjusted based on the voicing level.

In a third embodiment, a method for personalized voice operable control can include capturing an ambient sound from at least one Ambient Sound Microphone (ASM) to produce an electronic ambient signal, delivering audio content to an ear canal by way of an Ear Canal Receiver (ECR) to produce an acoustic audio content, and capturing in the ear canal an internal sound from at least one Ear Canal Microphone (ECM) to produce an electronic internal signal. The electronic internal signal can include an echo of the acoustic audio content and a spoken voice generated by a wearer of the earpiece. The method can include detecting a spoken voice signal in the electronic internal signal based on an analysis of the electronic ambient sound signal and the electronic internal signal in the presence of the echo. At least one voice operation of the earpiece can be controlled in the presence of the echo if the spoken voice is detected.

In a fourth embodiment, an earpiece for personalized voice operable control can include an Ambient Sound Microphone (ASM) configured to capture ambient sound and produce an electronic ambient signal, an Ear Canal Receiver (ECR) to deliver audio content to the ear canal to produce an acoustic audio content, and an Ear Canal Microphone (ECM) configured to capture internal sound in an ear canal and produce an electronic internal signal. The internal sound can include an echo of the acoustic audio content. The earpiece can include a processor operatively coupled to the ASM, the ECM and the ECR to detect a spoken voice signal in the electronic internal signal based on an analysis of the electronic ambient sound signal and the electronic internal signal, wherein the spoken voice is generated by a wearer of the earpiece.

The earpiece can include an echo canceller communicatively coupled to the processor, where the echo canceller is configured to suppress the echo of the audio content in the electronic internal signal to produce a modified electronic internal signal. The earpiece can include a voice operated control (VOX) operatively coupled to the processor that can generate a voice activity level of the spoken voice based on the electronic ambient signal and the modified electronic internal signal. The VOX can control a mixing of the electronic ambient signal and the modified electronic internal signal based on the voice activity level for producing a mixed signal. The VOX can accept communications from at least one among a cell phone, a media player, a portable computing device, and a personal digital assistant for providing the audio content. The VOX can further control a second mixing of the audio content and the mixed signal delivered together to the ECR. A transceiver operatively coupled to the processor can transmit the mixed signal to at least one among a cell phone, a media player, a portable computing device, and a personal digital assistant.

In a fifth embodiment, an earpiece can include an Ambient Sound Microphone (ASM) configured to capture ambient sound and produce an electronic ambient signal, an Ear Canal Microphone (ECM) configured to capture internal sound in an ear canal and produce an electronic internal signal, an Ear Canal Receiver (ECR) to deliver audio content to the ear canal to produce an acoustic audio content, an echo canceller configured to suppress an echo of the audio content in the electronic internal signal to produce a modified electronic internal signal, and a processor operatively coupled to the ASM, the ECM, the ECR and the echo canceller to adjust a level of the audio content responsive to detecting from the electronic internal signal a spoken voice generated by a wearer of the earpiece in the presence of the acoustic audio content based on an analysis of the ambient sound signal and the electronic internal signal.

The earpiece can include a voice operated control (VOX) operatively coupled to the processor to generate a voice activity level of the spoken voice based on the electronic ambient signal and the modified electronic internal signal, and control at least one voice operation of the earpiece in the presence of the echo based on the voice activity level. The audio content can be at least one among a phone call, a voice message, and a music signal. A transceiver operatively coupled to the processor can transmit the mixed signal to at least one among a cell phone, a media player, a portable computing device, and a personal digital assistant.

DETAILED DESCRIPTION

Figure 1:
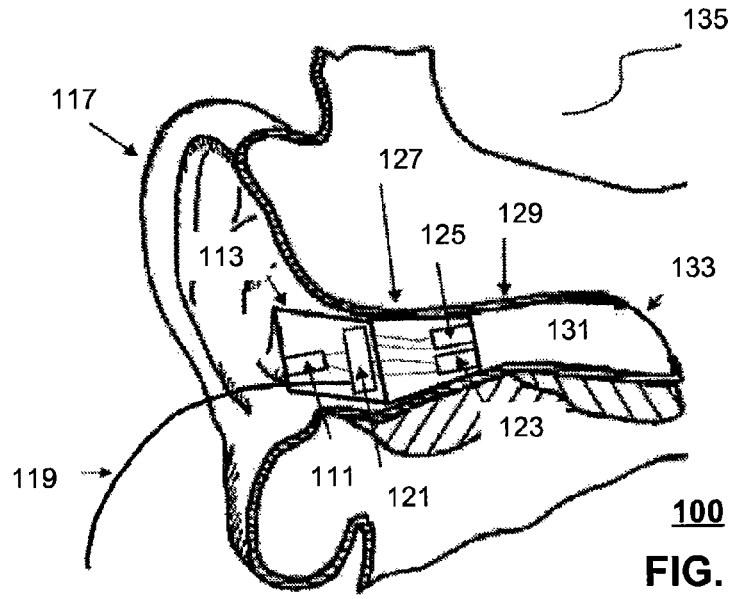
FIG. 1 is a pictorial diagram of an earpiece in accordance with an exemplary embodiment.

The following description of at least one exemplary embodiment is merely illustrative in nature and is in no way intended to limit the invention, its application, or uses.

Processes, techniques, apparatus, and materials as known by one of ordinary skill in the relevant art may not be discussed in detail but are intended to be part of the enabling description where appropriate, for example the fabrication and use of transducers.

In all of the examples illustrated and discussed herein, any specific values, for example the sound pressure level change, should be interpreted to be illustrative only and non-limiting. Thus, other examples of the exemplary embodiments could have different values.

Note that similar reference numerals and letters refer to similar items in the following figures, and thus once an item is defined in one figure, it may not be discussed for following figures.

Note that herein when referring to correcting or preventing an error or damage (e.g., hearing damage), a reduction of the damage or error and/or a correction of the damage or error are intended.

At least one exemplary embodiment of the invention is directed to an earpiece for voice operated control. Reference is made to FIG. 1 in which an earpiece device, generally indicated as earpiece 100, is constructed and operates in accordance with at least one exemplary embodiment of the invention. As illustrated, earpiece 100 depicts an electro-acoustical assembly 113 for an in-the-ear acoustic assembly, as it would typically be placed in the ear canal 131 of a user 135. The earpiece 100 can be an in the ear earpiece, behind the ear earpiece, receiver in the ear, open-fit device, or any other suitable earpiece type. The earpiece 100 can be partially or fully occluded in the ear canal, and is suitable for use with users having healthy or abnormal auditory functioning.

Earpiece 100 includes an Ambient Sound Microphone (ASM) 111 to capture ambient sound, an Ear Canal Receiver (ECR) 125 to deliver audio to an ear canal 131, and an Ear Canal Microphone (ECM) 123 to assess a sound exposure level within the ear canal 131. The earpiece 100 can partially or fully occlude the ear canal 131 to provide various degrees of acoustic isolation. The assembly is designed to be inserted into the user's ear canal 131, and to form an acoustic seal with the walls 129 of the ear canal at a location 127 between the entrance 117 to the ear canal and the tympanic membrane (or ear drum) 133. Such a seal is typically achieved by means of a soft and compliant housing of assembly 113. Such a seal creates a closed cavity 131 of approximately 5 cc between the in-ear assembly 113 and the tympanic membrane 133. As a result of this seal, the ECR (speaker) 125 is able to generate a full range bass response when reproducing sounds for the user. This seal also serves to significantly reduce the sound pressure level at the user's eardrum 133 resulting from the sound field at the entrance to the ear canal 131. This seal is also a basis for a sound isolating performance of the electro-acoustic assembly.

Located adjacent to the ECR 125, is the ECM 123, which is acoustically coupled to the (closed or partially closed) ear canal cavity 131. One of its functions is that of measuring the sound pressure level in the ear canal cavity 131 as a part of testing the hearing acuity of the user as well as confirming the integrity of the acoustic seal and the working condition of the earpiece 100. In one arrangement, the ASM 111 can be housed in the assembly 113 to monitor sound pressure at the entrance to the occluded or partially occluded ear canal 131. All transducers shown can receive or transmit audio signals to a processor 121 that undertakes audio signal processing and provides a transceiver for audio via the wired or wireless communication path 119.

The earpiece 100 can actively monitor a sound pressure level both inside and outside an ear canal and enhance spatial and timbral sound quality while maintaining supervision to ensure safes sound reproduction levels. The earpiece 100 in various embodiments can conduct listening tests, filter sounds in the environment, monitor warning sounds in the environment, present notification based on identified warning sounds, maintain constant audio content to ambient sound levels, and filter sound in accordance with a Personalized Hearing Level (PHL).

The earpiece 100 can generate an Ear Canal Transfer Function (ECTF) to model the ear canal 131 using ECR 125 and ECM 123, as well as an Outer Ear Canal Transfer function (OETF) using ASM 111. For instance, the ECR 125 can deliver an impulse within the ear canal and generate the ECTF via cross correlation of the impulse with the impulse response of the ear canal. The earpiece 100 can also determine a sealing profile with the user's ear to compensate for any leakage. It also includes a Sound Pressure Level Dosimeter to estimate sound exposure and recovery times. This permits the earpiece 100 to safely administer and monitor sound exposure to the ear.

Figure 2:
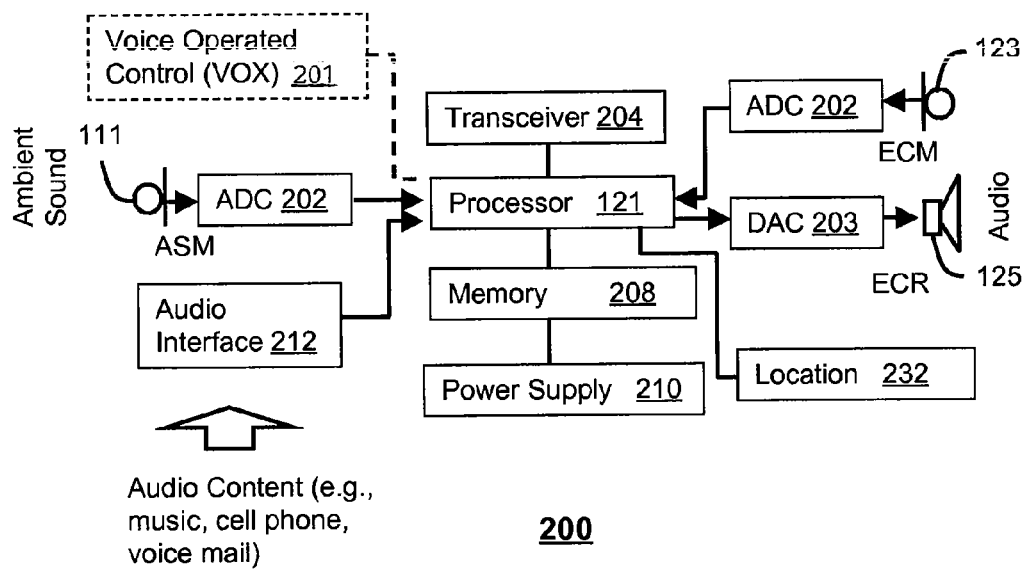
FIG. 2 is a block diagram of the earpiece in accordance with an exemplary embodiment.

Referring to FIG. 2, a block diagram 200 of the earpiece 100 in accordance with an exemplary embodiment is shown. As illustrated, the earpiece 100 can include the processor 121 operatively coupled to the ASM 111, ECR 125, and ECM 123 via one or more Analog to Digital Converters (ADC) 202 and Digital to Analog Converters (DAC) 203. The processor 121 can utilize computing technologies such as a microprocessor, Application Specific Integrated Chip (ASIC), and/or digital signal processor (DSP) with associated storage memory 208 such as Flash, ROM, RAM, SRAM, DRAM or other like technologies for controlling operations of the earpiece device 100. The processor 121 can also include a clock to record a time stamp.

As illustrated, the earpiece 100 can include a voice operated control (VOX) module 201 to provide voice control to one or more subsystems, such as a voice recognition system, a voice dictation system, a voice recorder, or any other voice related processor. The VOX 201 can be a hardware component implemented by discrete or analog electronic components or a software component. In one arrangement, the processor 121 can provide functionality of the VOX 201 by way of software, such as program code, assembly language, or machine language.

The earpiece 100 can measure ambient sounds in the environment received at the ASM 111. Ambient sounds correspond to sounds within the environment such as the sound of traffic noise, street noise, conversation babble, or any other acoustic sound. Ambient sounds can also correspond to industrial sounds present in an industrial setting, such as, factory noise, lifting vehicles, automobiles, an robots to name a few.

The memory 208 can also store program instructions for execution on the processor 121 as well as captured audio processing data. For instance, memory 208 can be off-chip and external to the processor 121, and include a data buffer to temporarily capture the ambient sound and the internal sound, and a storage memory to save from the data buffer the recent portion of the history in a compressed format responsive to a directive by the processor. The data buffer can be a circular buffer that temporarily stores audio sound at a current time point to a previous time point. It should also be noted that the data buffer can in one configuration reside on the processor 121 to provide high speed data access. The storage memory 208 can be non-volatile memory such as SRAM to store captured or compressed audio data.

The earpiece 100 can include an audio interface 212 operatively coupled to the processor 121 and VOX 201 to receive audio content, for example from a media player, cell phone, or any other communication device, and deliver the audio content to the processor 121. The processor 121 responsive to detecting voice operated events from the VOX 201 can adjust the audio content delivered to the ear canal. For instance, the processor 121 (or VOX 201) can lower a volume of the audio content responsive to detecting an event for transmitting the acute sound to the ear canal. The processor 121 by way of the ECM 123 can also actively monitor the sound exposure level inside the ear canal and adjust the audio to within a safe and subjectively optimized listening level range based on voice operating decisions made by the VOX 201.

The earpiece 100 can further include a transceiver 204 that can support singly or in combination any number of wireless access technologies including without limitation Bluetooth™, Wireless Fidelity (WiFi), Worldwide Interoperability for Microwave Access (WiMAX), and/or other short or long range communication protocols. The transceiver 204 can also provide support for dynamic downloading over-the-air to the earpiece 100. It should be noted also that next generation access technologies can also be applied to the present disclosure.

The location receiver 232 can utilize common technology such as a common GPS (Global Positioning System) receiver that can intercept satellite signals and therefrom determine a location fix of the earpiece 100.

The power supply 210 can utilize common power management technologies such as replaceable batteries, supply regulation technologies, and charging system technologies for supplying energy to the components of the earpiece 100 and to facilitate portable applications. A motor (not shown) can be a single supply motor driver coupled to the power supply 210 to improve sensory input via haptic vibration. As an example, the processor 121 can direct the motor to vibrate responsive to an action, such as a detection of a warning sound or an incoming voice call.

The earpiece 100 can further represent a single operational device or a family of devices configured in a master-slave arrangement, for example, a mobile device and an earpiece. In the latter embodiment, the components of the earpiece 100 can be reused in different form factors for the master and slave devices.

Figure 3:
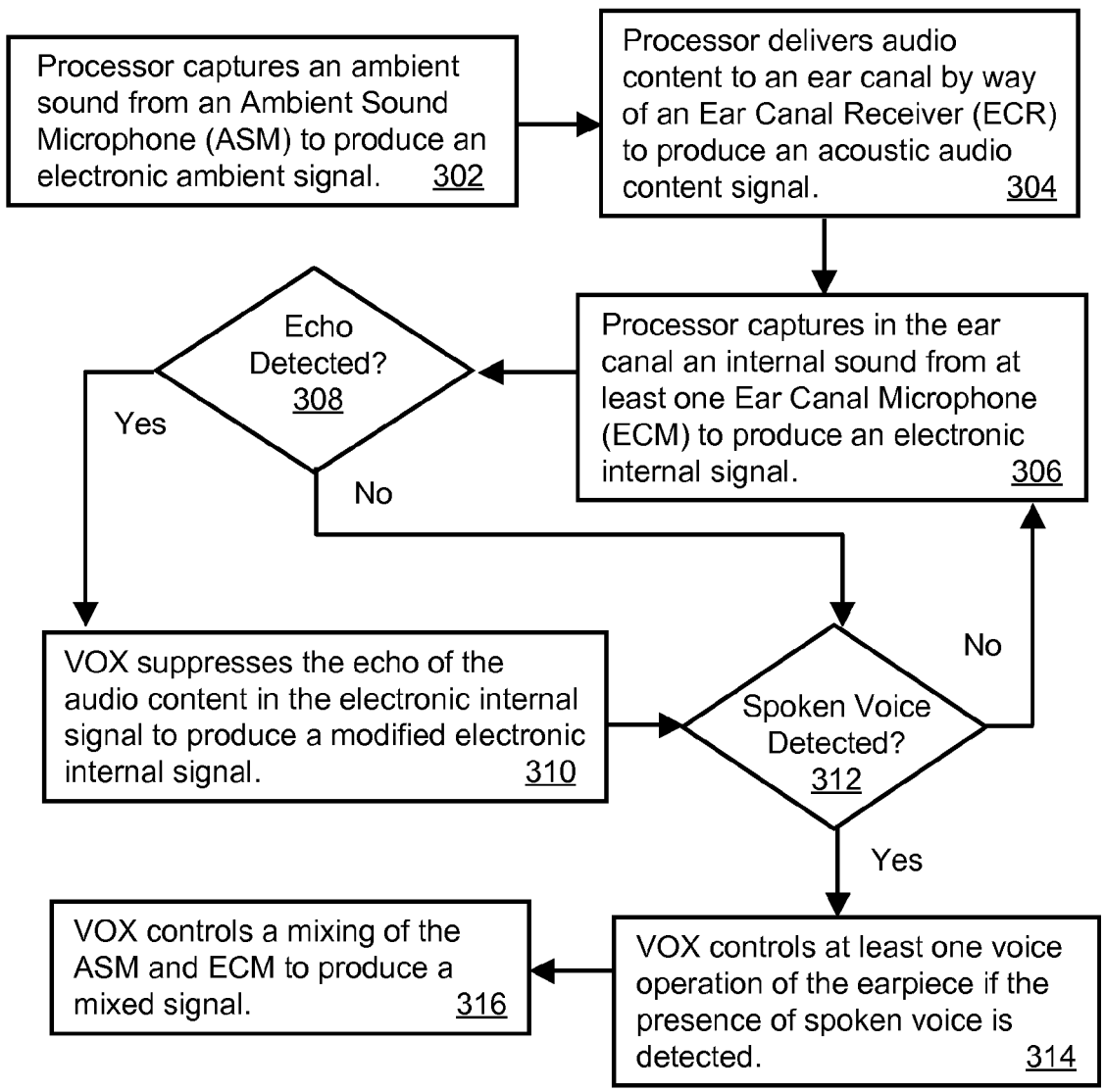
FIG. 3 is a flowchart of a method for personalized voice operated control in accordance with an exemplary embodiment.

FIG. 3 is a flowchart of a method 300 for personalized voice operated control in accordance with an exemplary embodiment. The method 300 can be practiced with more or less than the number of steps shown and is not limited to the order shown. To describe the method 300, reference will be made to FIGS. 4 and 5 and components of FIGS. 1 and 2, although it is understood that the method 300 can be implemented in any other manner using other suitable components. The method 300 can be implemented in a single earpiece, a pair of earpieces, headphones, or other suitable headset audio delivery device.

The method 300 can start in a state wherein the earpiece 100 has been inserted in an ear canal of a wearer. As shown in step 302, the earpiece 100 can measure ambient sounds in the environment received at the ASM 111. In particular, the processor 121 captures an acoustic ambient sound from an Ambient Sound Microphone (ASM) 111 to produce an electronic ambient signal. An "electronic signal" is a digital or analog signal that can be processed by the processor 121, for instance, represented by voltage or current. An "acoustic sound" or "sound" is a pressure wave or sound wave, for example, represented in units of Pascals. Ambient sounds correspond to sounds within the environment such as the sound of traffic noise, street noise, conversation babble, or any other acoustic sound. Ambient sounds can also correspond to industrial sounds present in an industrial setting, such as, factory noise, lifting vehicles, automobiles, and robots to name a few.

At step 304 the processor 121 can deliver audio content to the ear canal 131 by way of the ECR 125 to produce an acoustic audio content. The audio content can be a phone call, a voice message, and a music signal, or any other audio signal. The audio content can also include the ambient sound passed from the ASM 111 to the ECR 125, and that can include the wearer's own voice. Delivering ambient sound as audio content to the ear canal allows the user to hear himself or herself when speaking. Notably, since the ear canal may be occluded by the earpiece, the ambient sound of the wearer's voice when speaking can be passed through the earpiece 100 as a loopback to allow the user to hear his or her own voice.

The audio content can be delivered by way of the audio interface 212 connected to a portable communication device such as a media player, cell phone, laptop, or any other suitable communication device. Notably, the processor 121 has access to the line-signal of the audio content; that is, it can evaluate and process the digital or analog waveforms sent to the ECR 125 before the ECR 125 transmits the audio content to produce the acoustic audio content. The audio content prior to being delivered to the ECR 125 can be in a pulse code modulated (PCM) format, for example, with 24-bit or higher dynamic range at various sampling frequencies (e.g., 32 KHz, 44.1 KHz, etc.) These line signals also include the ambient sound received by the ASM 111 at the processor 121.

At step 306, the processor captures in the ear canal 131 an internal sound from the ECM 123 to produce an electronic internal signal. The internal sound will include aspects of the acoustic audio content as well as the wearer's spoken voice if the wearer is speaking and/or simultaneously listening to music. As noted above, the internal sound can include aspects of the ambient sound that is passed through the ASM 111 to the ECR 125. In such case, the electronic internal signal includes an echo of the acoustic audio content and also the spoken voice generated by the wearer of the earpiece. The echo is not a complete reproduction of the acoustic audio content, but rather a non-linear version of the audio content affected by transmission properties of the ear canal due to an ear canal transfer function (ECTF). The enclosed air chamber (~5 cc volume) within the wearer's ear canal due to the occlusion of the earpiece 100 causes a build up of sound waves when the wearer speaks. Accordingly, the ECM 123 picks up the wearer's voice in the ear canal along with the echo of the acoustic audio content when the wearer is speaking and the ear canal is occluded. Thus the electronic internal signal contains sound waves captured internally in the wearer's ear canal generated via bone conduction (from the spoken voice) and also the echo (from the acoustic audio content).

In certain situations, it may be necessary for the earpiece 100 to determine whether the wearer is speaking; for instance, if the wearer is issuing a voice command to place a call, vocally responding to a caller, or speaking to someone in his or her close proximity. In such cases it is important for the earpiece 100 to determine whether the internal and ambient sounds captured at the ECM 123 or ASM 111 correspond to the wearer's spoken voice, someone else's voice external but near to the earpiece 100, or a voice from audio content playing in the wearer's ear canal. Moreover, the echo of the acoustic audio content due to propagation delays, sealing properties, and bone conduction transfers can further complicate the voice decision process. Thus the earpiece 100 first assesses whether echo is present prior making a voice decision.

If at step 308, an echo is detected, the processor 121 can then suppress the echo of the audio content in the electronic internal signal to produce a modified electronic internal signal as shown in step 310. Upon echo suppression, the modified electronic internal signal contains primarily the spoken voice; that is, with minimal echo of the acoustic audio content. If an echo is not detected, the VOX 201 can continue to step 312 to determine if spoken voice is detected in the internal signal.

Figure 4:
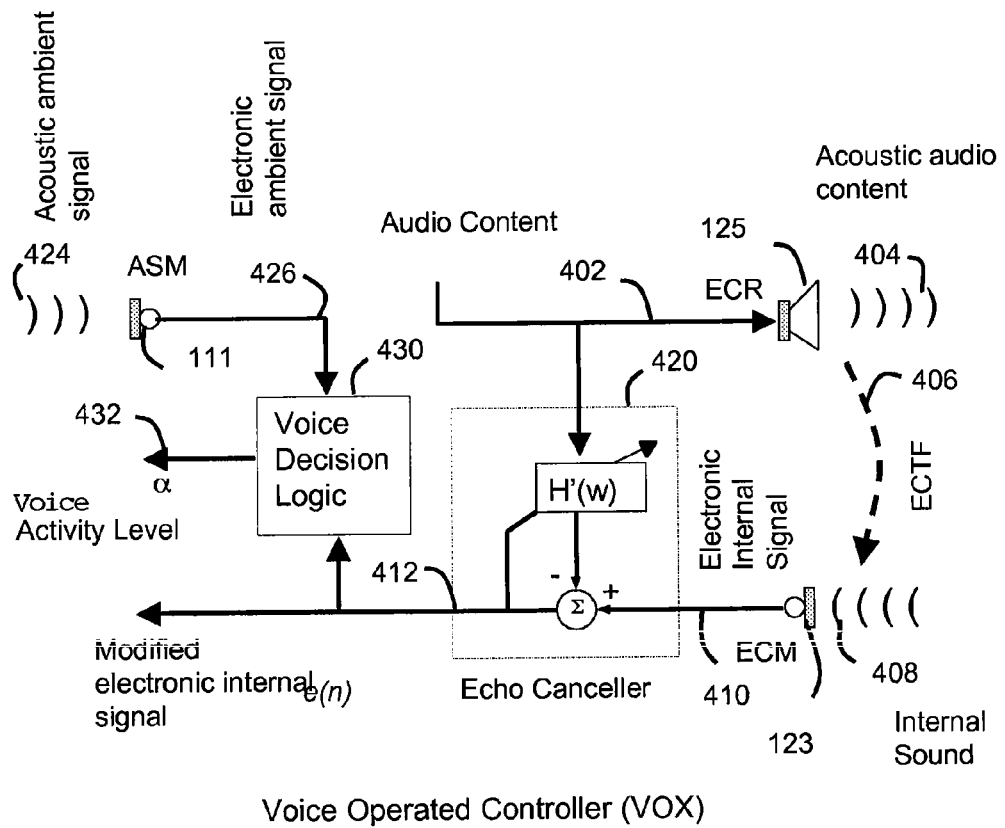
FIG. 4 is a block diagram for audio content echo cancellation in accordance with an exemplary embodiment.

Briefly referring to FIG. 4, a block diagram for the voice operated control 201 employing echo cancellation is shown. As illustrated, the echo canceller 420 is coupled to a line signal 402 of the ECR 125 and a line signal 410 of the ECM 123. The echo canceller 420 estimates an ear canal transfer function (ECTF) 406 between the ECR 125 and the ECM 125. The ECTF 406 describes the amplitude and phase transmissions for the path between the ECR 125 and the ECM 123. In particular, audio content is delivered along the line 402 to the ECR 125 which produces the acoustic audio content 404. The acoustic audio content 404 is delivered to the ear canal 131 (see FIG. 1) and generates echoes that are received at the ECM 123 in accordance with the ECTF 406 and that are present in the electronic internal signal 410. When the wearer is speaking, the internal sound 408 will include the wearer's spoken voice due to bone conduction within the ear canal in addition to the echo from the acoustic audio content.

The echo canceller 420 receives as input the audio content from the line 402 and the electronic internal signal from the line 410, and produces a modified electronic signal 412 (also considered an error signal) that is sufficiently free of the echo. The error signal is used to adapt one or more weights of an adaptive filter within the echo canceller to learn characteristics of the ECTF 406. Broadly stated, the echo canceller 420 estimates the ECTF and subtracts—in an optimal mean squared error sense—the echo of the audio content from the internal sound to leave only the spoken voice signal in the modified electronic internal signal. Stated differently, the echo canceller 420 estimates the bone conduction transfer function of the ear canal (i.e., ECTF 406) and suppresses the echo due to the transfer function thereby producing a modified electronic signal 412 that is primarily the spoken voice sufficiently and free of the echo.

As shown, the VOX 201 includes a voice decision logic 430 for determining the presence of spoken voice. The voice decision logic 430 receives as input the modified electronic signal 412 produced from the echo canceller 420 and the electronic ambient signal 426 produced from the ASM 111 capturing the acoustic ambient signal 424. When the wearer of the earpiece 100 is speaking, the spoken voice is captured at the ASM 111 and also captured internally at the ECM 123. Accordingly, the voice decision logic 430 refers to both the electronic ambient signal 426 and the modified electronic signal 412 (primarily containing the internal sound of the spoken voice minus the echo of the audio content) in assessing voice activity levels 432. A voice activity level 432 can correspond to a 0 for no voice, or a 1 for voice. Alternatively, the voice activity level 432 can be a soft decision, for example, between 0 and 10 indicating a probability or likelihood of voice presence.

Returning back to FIG. 3, the VOX 201 can determine whether spoken voice is present at step 312. For instance, as just described in FIG. 4, the voice decision logic 430 can compare the electronic ambient signal 426 and the modified electronic internal signal 412 (i.e., echo suppressed internal) to determine if the wearer (i.e., the user wearing the earpiece 100) of the earpiece 100 is speaking. In particular, the voice decision logic 430, by way of one or more decisional approaches, such as correlation analysis, level-detection, coherence, and spectral analysis, can determine whether the sounds correspond to the wearer's voice or ambient sounds in the environment, such as other users talking in a conversation. That is, the voice decision logic 430 determines if the electronic ambient signal 426 and the modified electronic internal signal 412 correspond to the wearer's voice, other voices in the wearer's environment, or voices within the audio content.

Returning back to FIG. 3, if spoken voice is detected, the VOX 201 can control at least one voice operation of the earpiece as shown in step 314. For instance, the VOX 201 having identified voice activity levels can pass command to another module such as a voice recognition system, a voice dictation system, a voice recorder, or any other voice processing module. The VOX 201 can also provide to the voice processing module a mixed signal that is a combination of the electronic ambient signal 426 and the modified electronic internal signal 412 as will be described ahead. A voice processing system can then analyze the spoken voice for information, such as voice commands, speaking levels, articulation, or background noises. The voice processing system can further examine a history of spoken voice from previously recorded information. If spoken voice from the wearer is not detected, the method 300 can proceed back to step 306 to monitor internal sounds for echoes.

At step 316, the VOX 201 can proceed to control a mixing of the ambient sound received at the ASM 111 with the modified electronic internal signal 412 received from the echo canceller 420 (see FIG. 4) to produce the mixed signal. The mixed signal can be provided to the voice processing modules identified in step 314. For instance, the mixed signal, which contains primarily the spoken voice without the echo of the audio content, can be passed directly to a voice recognition system, a voice recorder, or to another communication device such as a phone. In such regard, the VOX 201 by way of the echo cancellation allows the user to communicate via the ECM 123 while listening to music playing in his or her ear canal.

The mixing can include adjusting the gain of the ambient sound (e.g., electronic ambient signal 426) and internal sound (e.g, modified internal electronic signal 412, or electronic internal signal 410) with respect to background noise levels. For instance, the VOX 201 upon deciding that the sounds captured at the ASM 111 and ECM 123 originate from the wearer of the earpiece 100 can combine the ambient sound and the internal sound with different gains to produce a mixed signal. The mixed signal may apply weightings more towards the ambient sound or internal sound depending on the background noise level, wearer's vocalization level, or spectral characteristics. The internal sound can correspond to the modified internal electronic signal 412, the electronic internal signal 410, or a combination of both.

Figure 5:
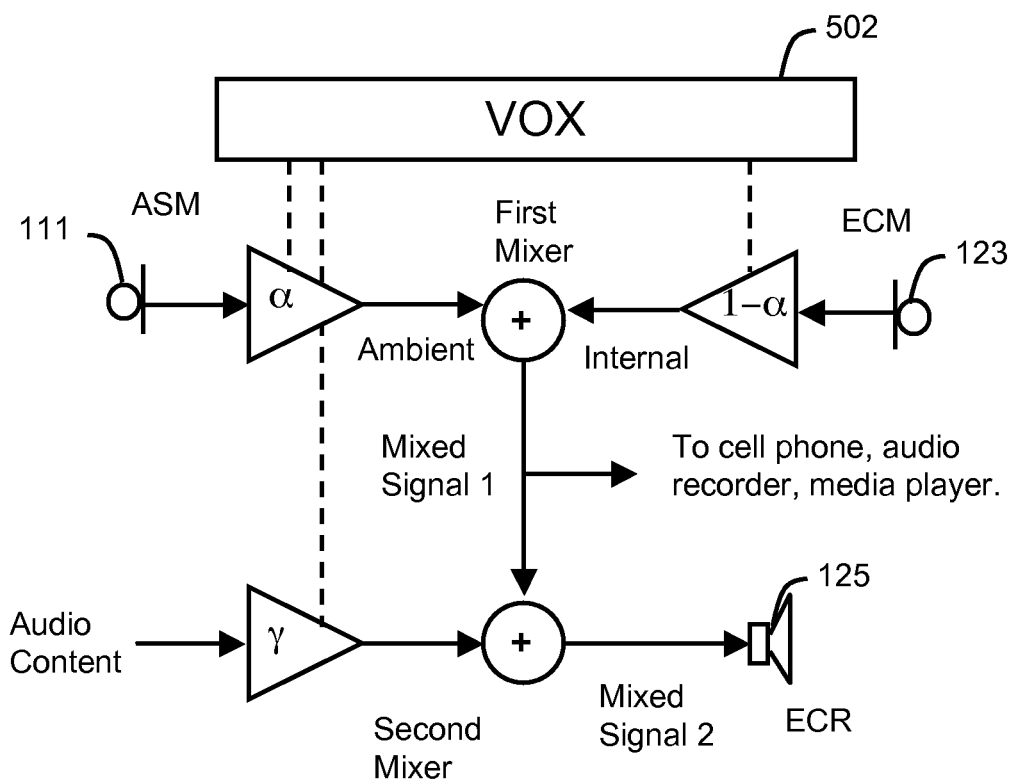
FIG. 5 is a block diagram for mixing sounds responsive to voice operated control in accordance with an exemplary embodiment.

For instance, referring to FIG. 5, a block diagram 500 for the mixing arrangement is shown. The VOX 201 can include algorithmic modules 502 for correlation, level detection, coherence, and spectral analysis. The VOX 201 applies one or more of these decisional approaches, as will be further described ahead, for determining if the ambient sound and internal sound correspond to the wearer's spoken voice. In the decisional process, the VOX 201 can assign mixing gains ($\alpha$) and ($1-\alpha$) to the electronic ambient signal 426 (see FIG. 4) from the ASM 111 and the electronic internal signal 410 or modified electronic internal signal 412 (see FIG. 4) from the ECM 123. These mixing gains establish how the electronic ambient signals and (modified) electronic internal signals are combined for further processing. The VOX 201 can also assign a mixing gain ($\gamma$) to the audio content.

In one arrangement based on correlation, the processor 121 determines if the modified electronic internal signal 412 arrives before the electronic ambient signal 426 at the ASM 111. Since the wearer's voice is generated via bone conduction in the ear canal, it travels a shorter distance than the acoustic wave emanating from the wearer's mouth to the ASM 111 at the wearer's ear. The VOX 201 can analyze the timing of one or more peaks in a cross correlation between the electronic ambient signal 426 and the modified electronic internal signal 412 to determine whether the sound originates from the ear canal, thus indicating that the wearer's voice generated the sound. Whereas, sounds generated external to the ear canal, such as those of neighboring talkers, reach the ASM 111 before passing through the earpiece 100 into the wearer's ear canal. A spectral comparison of the electronic ambient signal 426 and modified electronic internal signal 412 can also be performed to determine the origination point of the captured sound.

In another arrangement based on level detection, the processor 121 determines if either the electronic ambient signal 426 or (modified) electronic internal signal 412 exceeds a predetermined threshold, and if so, compares a Sound Pressure Level (SPL) between the electronic ambient signal 426 and (modified) electronic internal signal 412 to determine if the sound originates from the wearer's voice. In general, the level of the modified electronic internal signal 412 is higher than the level of the electronic ambient signal 426 if the wearer of the earpiece 100 is speaking. Accordingly, a first metric is comparing the levels.

As indicated above, a threshold metric can be first employed so as to minimize the amount of processing required to continually monitor sounds in the wearer's environment before performing the comparison. The threshold establishes the level at which a comparison between the electronic ambient signal 426 and (modified) electronic internal signal 412 is performed. The threshold can also be established via learning principles, for example, wherein the earpiece 100 learns when the wearer is speaking and his or her speaking level in various noisy environments. For instance, the processor 121 can record background noise estimates from the ASM 111 while simultaneously monitoring the wearer's speaking level at the ECM 123 to establish the wearer's degree of vocalization relative to the background noise.

The VOX 201 can deliver the mixed signal to a portable communication device, such as a cell phone, personal digital assistant, voice recorder, laptop, or any other networked or non-networked system component (see also FIG. 4). Recall the VOX 201 can generate the mixed signal in view of environmental conditions, such as the level of background noise. So, in high background noises, the mixed signal will include more of the internal sound from the wearer's voice generated in ear canal and captured at the ECM 123 than the ambient sound with the high background noises. In a quiet environment, the mixed signal will include more of the ambient sound captured at the ASM 111 than the wearer's voice generated in ear canal. The VOX 201 can also apply various spectral equalizations to account for the differences in spectral timbre from the ambient sound and the internal sound based on the mixing scheme.

The VOX 201 can also control a second mixing of the mixed signal with the audio content to produce a second mixed signal (see FIG. 5). This second mixing provides loopback of the wearer's own voice to allow the wearer to hear himself or herself when speaking in the presence of audio content delivered to the ear canal via ECR 125. Upon mixing the mixed signal with the audio content, the VOX 201 can deliver the second mixed signal to the ECR 125 as part of the audio content (see FIG. 4). In such regard, the VOX 201 permits the wearer to monitor his or her own voice and with the audio content.

Figure 6:
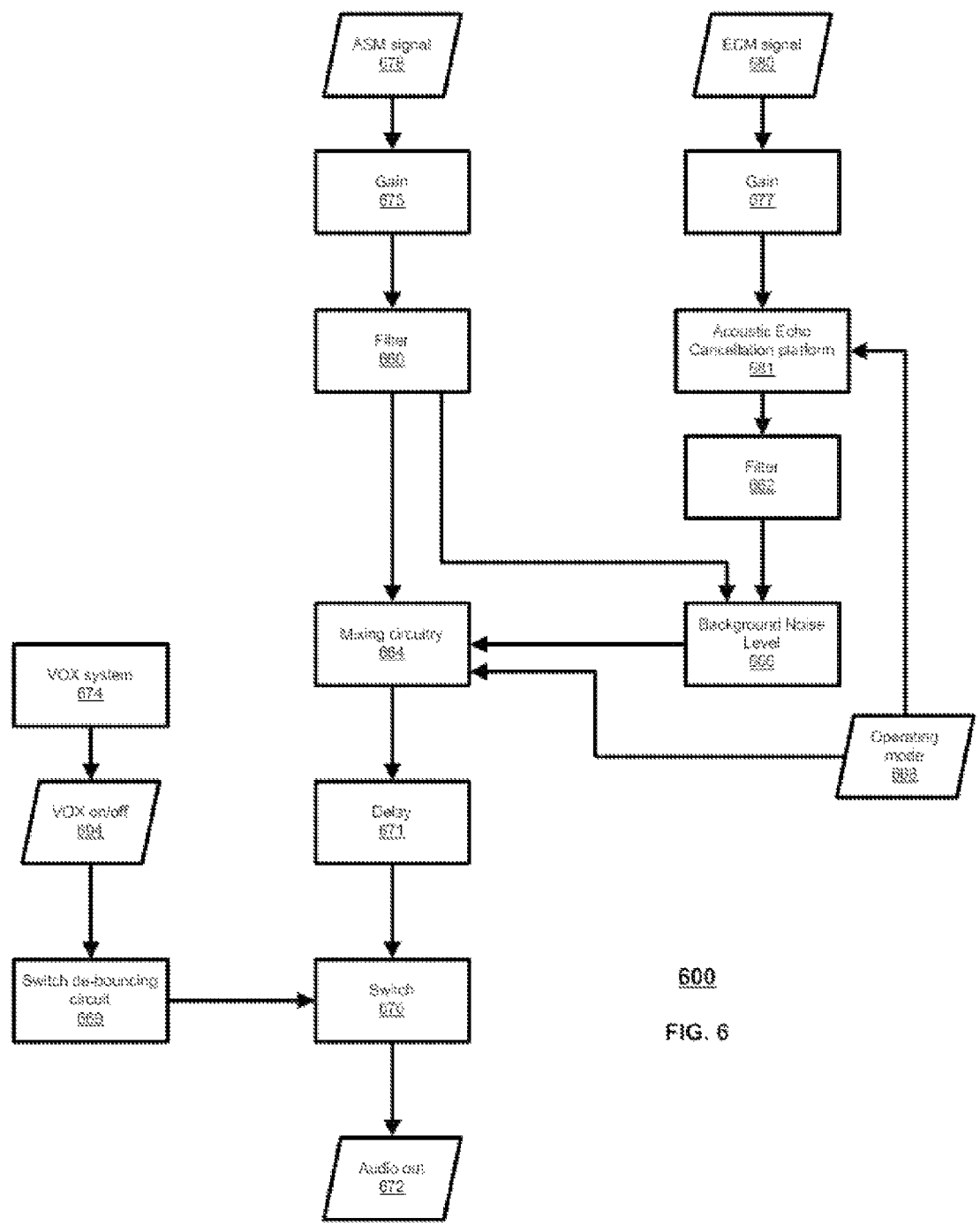
FIG. 6 is a flowchart for acoustic cancellation and voice operated control in an earpiece in accordance with an exemplary embodiment.

FIG. 6 is a flowchart for another embodiment of acoustic cancellation and voice operated control in an earpiece. As illustrated, the ASM signal 678 is first amplified with gain system 675 and then filtered with filter system 660. The filter system 660 facilitates for monitoring of the ASM signal with a natural sound quality for both the user and other parties, such as remote individuals. The ECM signal 680 is processed with gain system 677 and then may be optionally processed with the Acoustic Echo Cancellation (AEC) platform 681. The AEC platform may be activated with the operating mode selection system 668. The ECM signal may be further filtered with filter system 662, which provides similar functionality as filter unit 660, though it has different filter characteristics. The filtering may be undertaken using either digital or analog components to give the conditioned ASM and ECM signals.

The background noise level (BNL) is calculated with system 666 that uses as its input either or both the conditioned ASM and/or ECM signal(s). The BNL is a slow time weighted average of the level of the ASM and/or ECM signals, and may be weighted using a frequency-weighting system, e.g. to give an A-weighted SPL level. In a particular operating mode, specified by unit 668, the conditioned ASM signal is mixed with the conditioned ECM signal with a ratio dependant on the BNL using audio signal mixing unit 664. As the BNL increases, then the ASM signal is mixed with a ECM signal with a decreasing level, and when the BNL is above a particular value, then no ASM signal is mixed with the ECM signal.

When the VOX switch 670 is active, the mixed ASM and ECM signals are then sent to output unit 672. The switch de-bouncing circuit 669 ensures against the VOX rapidly closing on and off (sometimes called chatter). This can be achieved with a timing circuit using digital or analog electronics, and is a system familiar to those skilled in the art. For instance, with a digital system, once the VOX has been activated (by VOX on/off unit 694), a time starts to ensure that the switch 670 is not closed again within a given time period, e.g. 100 ms. The delay unit 671 can be used to improve the sound quality of the auditioned audio 672 by compensating for any latency in voice detection by the VOX system 674. Although shown separately, the VOX system 674 can include operations of the acoustic echo cancellation platform 681, background noise level 666, and the mixing circuitry 664 as in FIG. 4 and FIG. 5.

Primarily, FIG. 6 shows the use of the VOX 201 as a voice activity detector for activating the electronic switch 670 that controls the audio outlet 672 from one earphone which is a combination of the ASM signal 678 and ECM 680 signal. Though not shown, the same applies for the other earphone device for the right ear, if present. In a contra-lateral operating mode, the ASM and ECM signals are taken from opposite earphone devices, and a mix of these signal are reproduced with the ECR 125 in the earphone that is contra-lateral to the ECM signal, and the same as the ASM signal (the reproduction routing is described ahead in FIG. 7). For instance, in the contra-lateral operating mode, the ASM signal from the Right earphone device is mixed with the ECM signal from the left earphone device, and the audio signal corresponding to a mix of these two signals is reproduced with the Ear Canal Receiver (ECR) in the Right earphone device. The audio outlet 672 therefore contains a mix of the ASM and ECM signals when the user's voice is detected by the VOX. This audio signal can be used as a user Self-Monitor System to allow the user to hear their own voice as reproduced with the ear canal receiver, or it can be transmitted to another voice system, such as a mobile phone, walky-talky radio etc. The VOX system 674 that activates the switch 670 may be one of the previously described VOX embodiments, or may use a different method.

Figure 7:
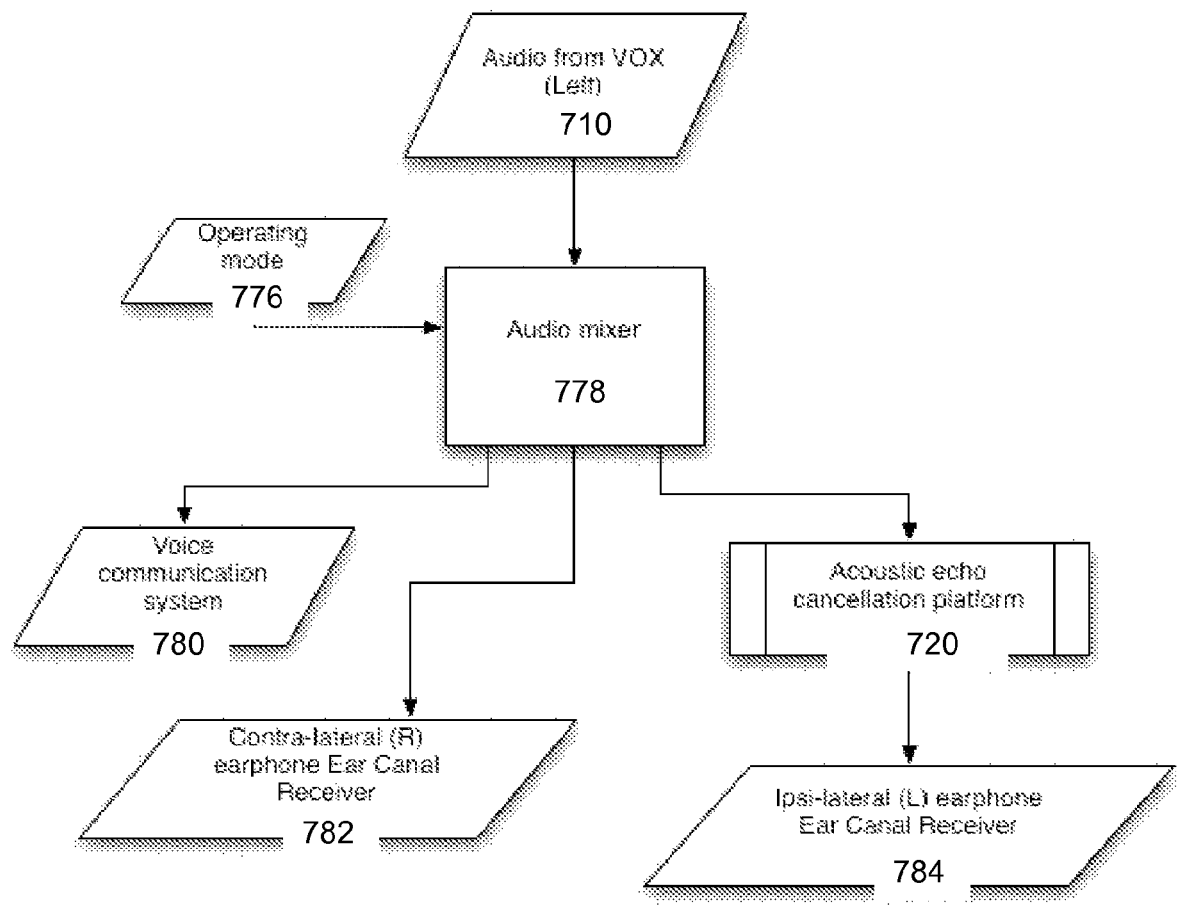
FIG. 7 is a flowchart for personalized voice operated control using dual earpieces in accordance with an exemplary embodiment.

FIG. 7 is a flowchart for personalized voice operated control using dual earpieces in accordance with one embodiment. As illustrated, the audio mixer 778 can receive as input the operating mode 776 and audio output from the VOX 710. Recall, the VOX 710 can produce a mixed signal that is a combination of ambient sound and internal sound (see FIG. 5). The audio mixer 778 can then pass the mixed signal to a voice communication system 780, and a contra-lateral Ear Canal Receiver 782 (e.g., right ECR 125). The acoustic echo cancellation platform 720 can operate on the mixed signal to remove echo from the audio content. The echo suppressed mixed signal can then be presented to an ipsi-lateral Ear Canal Receiver 784 (e.g., Left ECR).

Briefly, FIG. 7 illustrates how the mixed output from the audio mixer 778 can be passed to a voice communication system 780 such as a walkie-talkie radio, mobile phone, voice-controlled computing device, speech-to-text system, and voice recognition system. FIG. 7 also shows how the audio signal from the VOX 710 may be mixed with mixer 778 and auditioned by the user with the Ear Canal Receiver (ECR) loudspeakers 782 and 784. If two earphone devices are used, then in the Contra-lateral operating mode the VOX output signal from the left earphone device is replayed with the right ECR, and vice-versa. In another embodiment with the ipsi-lateral operating mode, the VOX signal from the ASM and ECM in one earphone can also be monitored by the user with the ECR in that same earphone. The ipsi-lateral operating mode employs the acoustic feedback control system 720 to ensure against acoustic feedback (or "howl") from acoustic coupling between the ECM and ECR.

Figure 8:
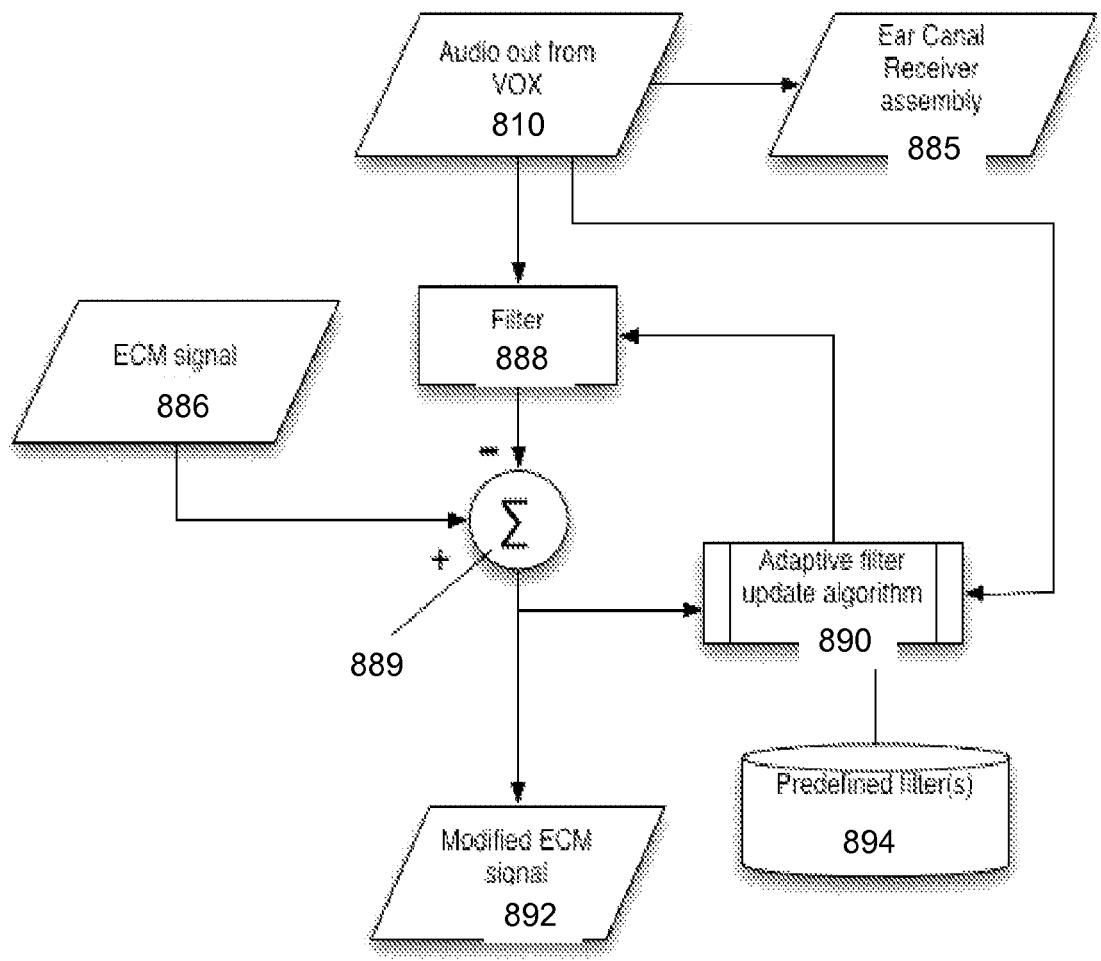
FIG. 8 is a flowchart for echo cancelling to reduce feedback from coupling of an ear canal microphone and an ear canal receiver in a same earpiece in accordance with an exemplary embodiment.

FIG. 8 is a flowchart for echo cancelling to reduce feedback from coupling of an ear canal microphone and an ear canal receiver in a same earpiece in accordance with an exemplary embodiment. A method or device implementing method steps of flowchart 800 can produce a modified ECM signal 892 that is sufficiently free of echo due to coupling of ECM 123 and ECR 125 (also referred to herein as ear canal receiver assembly 885). In one embodiment, the filter 888 which filters the audio output signal (e.g., mixed signal) from the VOX is a fixed (predefined) filter 894. In such a case, the filtering can be undertaken using either analog or digital electronics. An impulse response (IR) of the filter 888 approximates the electro-acoustic impulse response (i.e. the time domain equivalent of the frequency-domain transfer function) between the ECM 123 and ECR 125 in the same earphone device. The IR can be measured by reproducing a test signal from the ECR 125 and recording the response with the ECM 123 in the same earphone, when the earphone is fitted in the ear canal of a user. Such test signals can include transient clicks (i.e. a Dirac function) or maximum length sequence (MLS) signals.

Another implementation which can be useful for suddenly changing acoustic environments, such as may occur if the earphone device is suddenly moved or repositioned in the ear canal, provides a plurality of fixed filters. The VOX can select a filter that gives the "best match" of the acoustic IR according to a particular criterion, such as a mean squared error comparison. For instance, the criterion can be the level of the output signal 892; whereby the best-match IR gives the smallest level of the difference between the ECM signal 886 and the VOX filtered VOX signal 810, as calculated with differencing unit 889.

Alternatively, an adaptive filter can be used in place or in addition with the discrete filter method. To update the filter 888, the modified ECM signal 892 is kept at a minimum level to ensure that the adaptive filter 890 best approximates the IR between the ECM 123 and ECR 125. One adaptive filter algorithm is based on the Least Means Square (LMS) algorithm; a derivative of the LMS is the frequency-domain Normalized LMS (NLMS) algorithm. The NLMS uses a Finite Impulse Response (FIR)-type transversal filter in the time domain or frequency domain to estimate the IR. For a small closed acoustic space, such as the ear canal, where the sound wave propagation is short, a short length FIR filter is suitable to model the echo latency, and can be efficiently realized in hardware and software.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures and functions of the relevant exemplary embodiments. Thus, the description of the invention is merely exemplary in nature and, thus, variations that do not depart from the gist of the invention are intended to be within the scope of the exemplary embodiments of the present invention. Such variations are not to be regarded as a departure from the spirit and scope of the present invention.

What is claimed is:

1. A method for personalized voice operable control, the method comprising the steps of:
    capturing an ambient sound from at least one Ambient Sound Microphone (ASM) to produce an electronic ambient signal;
    delivering audio content to an ear canal by way of an Ear Canal Receiver (ECR) of an earpiece to produce an acoustic audio content;
    capturing in the ear canal an internal sound from at least one Ear Canal Microphone (ECM) to produce an electronic internal signal, wherein the electronic internal signal includes an echo of the acoustic audio content and a sound signal;
    suppressing the echo of the acoustic audio content in the electronic internal signal to produce a modified electronic internal signal containing the sound signal;
    detecting a presence of a spoken voice signal generated by a wearer of the earpiece in the modified electronic internal signal based on an analysis of both the electronic ambient signal and the modified electronic internal signal, the analysis including comparing the modified electronic internal signal to the electronic ambient signal to determine whether the sound signal originates in the ear canal or external to the ear canal, the sound signal indicating the presence of the spoken voice signal when the sound signal originates in the ear canal; and
    controlling at least one voice operation of the earpiece if the spoken voice signal is detected.

2. The method of claim 1, wherein the suppressing is performed by way of a normalized least mean squares algorithm.

3. The method of claim 1, comprising estimating an ear canal transfer function from the audio content and the electronic internal signal.

4. The method of claim 1, comprising generating a voice activity level of the spoken voice signal based on the electronic ambient signal and the modified electronic internal signal.

5. The method of claim 4, comprising controlling a mixing of the electronic ambient signal and the modified electronic internal signal based on the voice activity level for producing a mixed signal.

6. The method of claim 5, comprising transmitting the mixed signal to at least one among a cell phone, a media player, a portable computing device, and a personal digital assistant.

7. The method of claim 5, comprising controlling a further mixing of the audio content and the mixed signal delivered together to the ear canal, where the audio content includes the spoken voice signal received from the ASM and at least one among a phone call, a voice message, and a music signal.

8. A method for personalized voice operable control, the method comprising the steps of:
    capturing an ambient sound from at least one Ambient Sound Microphone (ASM) to produce an electronic ambient signal;
    capturing in an ear canal an internal sound from at least one Ear Canal Microphone (ECM) of an earpiece to produce an electronic internal signal, wherein the electronic internal signal includes an echo of an acoustic audio content and a sound signal;
    suppressing the echo of the acoustic audio content in the electronic internal signal to produce a modified electronic internal signal containing the sound signal;
    detecting a presence of a spoken voice signal generated by a wearer of the earpiece in the modified electronic internal signal based on an analysis of both the electronic ambient signal and the modified electronic internal signal, the analysis including comparing the modified electronic internal signal to the electronic ambient signal to determine whether the sound signal originates in the ear canal or external to the ear canal, the sound signal indicating the presence of the spoken voice signal when the sound signal originates in the ear canal; and
    generating a voice activity level of the spoken voice signal based on the electronic ambient signal and the modified electronic internal signal.

9. The method of claim 8, comprising suppressing the echo in the electronic internal signal by way of a least mean squares algorithm.

10. The method of claim 8, comprising controlling a mixing of the electronic ambient signal and the modified electronic internal signal based on the voice activity level for producing a mixed signal.

11. The method of claim 8, comprising adjusting a volume level of an audio content producing the echo that is delivered to the ear canal based on the voice activity level.

12. A method for detecting a spoken voice signal, the method comprising the steps of:
capturing an ambient sound from at least one Ambient Sound Microphone (ASM) to produce an electronic ambient signal;
delivering audio content to an ear canal by way of an Ear Canal Receiver (ECR) of an earpiece to produce an acoustic audio content;
capturing in the ear canal an internal sound from at least one Ear Canal Microphone (ECM) to produce an electronic internal signal, wherein the electronic internal signal includes an echo of the acoustic audio content and a sound signal;
suppressing the echo of the acoustic audio content in the electronic internal signal to produce a modified electronic internal signal containing the sound signal; and
detecting a presence of a spoken voice signal generated by a wearer of the earpiece in the modified electronic internal signal based on an analysis of both the electronic ambient signal and the modified electronic internal signal, the analysis including comparing the modified electronic internal signal to the electronic ambient signal to determine whether the sound signal originates in the ear canal or external to the ear canal, the sound signal indicating the presence of the spoken voice signal when the sound signal originates in the ear canal.

13. The method of claim 12, comprising controlling at least one voice operation of the earpiece in the presence of the echo when the spoken voice signal is detected.

14. An earpiece for personalized voice operable control, comprising:
an Ambient Sound Microphone (ASM) configured to capture ambient sound and produce an electronic ambient signal;
an Ear Canal Receiver (ECR) configured to deliver audio content to an ear canal to produce an acoustic audio content;
an Ear Canal Microphone (ECM) configured to capture internal sound in the ear canal and produce an electronic internal signal, wherein the electronic internal signal includes an echo of the acoustic audio content and a sound signal;
an echo canceller configured to suppress the echo of the acoustic audio content in the electronic internal signal to produce a modified electronic internal signal containing the sound signal; and
a processor operatively coupled to the ASM, the ECM, the ECR and the echo canceller where the processor is configured to detect a presence of a spoken voice signal generated by a wearer of the earpiece in the modified electronic internal signal based on an analysis of both the electronic ambient signal and the modified electronic internal signal, the analysis, by the processor, including comparing the modified electronic internal signal to the electronic ambient signal to determine whether the sound signal originates in the ear canal or external to the ear canal, the sound signal indicating the presence of the spoken voice signal when the sound signal originates in the ear canal.

15. The earpiece of claim 14, further comprising a voice operated control (VOC) operatively coupled to the processor, wherein the VOC is configured to generate a voice activity level of the spoken voice signal based on the electronic ambient signal and the modified electronic internal signal.

16. The earpiece of claim 15, where the VOC controls a mixing of the electronic ambient signal and the modified electronic internal signal based on the voice activity level for producing a mixed signal.

17. The earpiece of claim 16, further comprising a transceiver operatively coupled to the processor and configured to transmit the mixed signal to at least one among a cell phone, a media player, a portable computing device, and a personal digital assistant.

18. The earpiece of claim 15, wherein the VOC is configured to accept communications from at least one among a cell phone, a media player, a portable computing device, and a personal digital assistant for providing the audio content.

19. The earpiece of claim 16, wherein the VOC controls a further mixing of the audio content and the mixed signal delivered together to the ECR.

20. An earpiece for personalized voice operable control, comprising:
an Ambient Sound Microphone (ASM) configured to capture ambient sound and produce an electronic ambient signal;
an Ear Canal Microphone (ECM) configured to capture internal sound in an ear canal and produce an electronic internal signal;
an Ear Canal Receiver (ECR) configured to deliver audio content to the ear canal to produce an acoustic audio content, the electronic internal signal including an echo of the acoustic audio content and a sound signal;
an echo canceller configured to suppress the echo of the acoustic audio content in the electronic internal signal to produce a modified electronic internal signal containing the sound signal; and
a processor operatively coupled to the ASM, the ECM, the ECR and the echo canceller where the processor is configured to adjust a level of the audio content responsive to detecting a presence of a spoken voice signal generated by a wearer of the earpiece based on an analysis of both the electronic ambient signal and the modified electronic internal signal, the analysis, by the processor, including comparing the modified electronic internal signal to the electronic ambient signal to determine whether the sound signal originates in the ear canal or external to the ear canal, the sound signal indicating the presence of the spoken voice signal when the sound signal originates in the ear canal.

21. The earpiece of claim 20, further comprising a voice operated control (VOC) operatively coupled to the processor, wherein the VOC generates a voice activity level of the spoken voice signal based on the electronic ambient signal and the modified electronic internal signal, and controls at least one voice operation of the earpiece in the presence of the echo based on the voice activity level.

22. The earpiece of claim 20, wherein the audio content is at least one among a phone call, a voice message, a music signal, and the spoken voice signal.

23. The earpiece of claim 20, wherein the earpiece is configured to control a mixing of the electronic ambient signal and the modified electronic internal signal based on the spoken voice signal to produce a mixed signal, the earpiece further comprising a transceiver operatively coupled to the processor and configured to transmit the mixed signal to at least one among a cell phone, a media player, a portable computing device, and a personal digital assistant.

* * * * *